(12) United States Patent
Pinlam et al.

(10) Patent No.: US 6,770,184 B1
(45) Date of Patent: Aug. 3, 2004

(54) INTEGRATED DE-IONIZED WATER PRESSURE MONITORING SYSTEM FOR SOLDER PLATING MACHINES

(75) Inventors: Watcharin Pinlam, Pathumthanee (TH); Chalor Moogdaharn, Nakornsawan (TH); Youthachai Bupparit, Nonthaburi (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 543 days.

(21) Appl. No.: 09/782,500

(22) Filed: Feb. 13, 2001

(51) Int. Cl.[7] ................ C25D 21/08; C25D 21/12
(52) U.S. Cl. ............ 205/81; 118/663; 118/712; 427/8; 427/355; 427/444; 204/227; 204/228.1; 205/82; 205/220
(58) Field of Search ............... 204/227, 228.1; 205/81, 82, 220; 118/663, 712; 427/8, 355, 444

(56) References Cited

U.S. PATENT DOCUMENTS

| | | | | |
|---|---|---|---|---|
| 4,029,114 A | * | 6/1977 | Wiltrout | 134/104.1 |
| 4,652,368 A | * | 3/1987 | Ennis et al. | 210/97 |
| 4,852,385 A | * | 8/1989 | Brinkmann | 73/1.02 |
| 4,914,814 A | | 4/1990 | Behun et al. | 29/843 |
| 5,023,202 A | | 6/1991 | Long et al. | 437/206 |
| 5,186,383 A | | 2/1993 | Melton et al. | 228/180.2 |
| 5,755,884 A | * | 5/1998 | Buckler et al. | 118/317 |
| 5,888,884 A | | 3/1999 | Wojnarowski | 438/462 |
| 6,013,571 A | | 1/2000 | Morrell | 438/612 |
| 6,093,957 A | | 7/2000 | Kwon | 257/666 |
| 6,114,759 A | | 9/2000 | Okuaki | 257/692 |

* cited by examiner

Primary Examiner—Roy King
Assistant Examiner—W. T. Leader
(74) Attorney, Agent, or Firm—Amin & Turocy, LLP

(57) ABSTRACT

The present invention provides a solder plating system with automatic monitoring of wash fluid pressure. The system automatically activates an alarm and/or initiates shutdown of a solder plating machine when the pressure reading indicates a failure of the wash fluid supply. The system thereby reduces the number of parts that are affected by failures in the wash fluid supply system. In some cases, problems with the wash fluid supply are detected before any parts are affected.

17 Claims, 5 Drawing Sheets

INTEGRATED DE-IONIZED WATER PRESSURE MONITORING SYSTEM FOR SOLDER PLATING MACHINES

TECHNICAL FIELD

The present invention generally relates to semiconductor packaging, and in particular to a system and method for solder plating lead frames.

BACKGROUND ART

A common integrated circuit ("IC") package type has the IC die encapsulated in plastic with external metal leads. The packaging process begins by placing the IC die on an island of a metal lead frame. FIG. 2 illustrates a typical lead frame 100 with islands 110. The IC die is connected to leads 120, with soldered wires for example. At this stage of the process, leads 120 are connected by dambars 130. To encapsulate the die, two halves of a plastic mold are placed around the IC die and the mold is filled with liquid plastic. As illustrated in FIG. 3, dambars 130 retain liquid plastic 140 within the mold 150. The plastic 160 that forms between the leads 120 next to the dambars 130 is referred to as "flash." After the plastic solidifies, the mold is taken away and the dambars and flash are removed.

To facilitate soldering of the leads, the metal lead frames are solder plated, usually prior to forming the IC package. After solder plating, lead frames are rinsed with hot de-ionized water. Poorly rinsed lead frames have discoloring due to acid contamination and other impurities, which are potential causes of corrosion and failure to pass solderability testing.

Solder plating machines commonly employed include a de-ionized water rinse to remove acid contamination and other impurities. However, parts such as lead frames are sometimes poorly rinsed due to problems in the de-ionized water supply, which causes a loss of material or expensive reworking. Problems with the de-ionized water supply are manifest by fluctuations, decrease, or loss of de-ionized water supply pressure and produce interruptions or variations in the flow of de-ionized water against the parts being rinsed.

It is known to provide a solder plating machine with a de-ionized water pressure gauge and to institute periodic inspection of that gauge. The gauge and inspection process sometimes leads to the discovery of problems in the de-ionized water supply. Nonetheless, there remains an unsatisfied need for a solder plating machine and method that reduces the occurrence of poorly rinsed lead frames.

SUMMARY OF THE INVENTION

The present invention provides a solder plating system with automatic monitoring of wash fluid pressure. The system automatically activates an alarm and/or initiates shutdown of a solder plating machine when the pressure reading indicates a failure of the wash fluid supply. The system thereby reduces the number of parts that are affected by failures in the wash fluid supply system. In some cases, problems with the wash fluid supply are detected before any parts are affected.

One aspect of the invention relates to a solder plating system comprising a solder plating machine, a wash fluid supply system for supplying wash fluid to the solder plating machine, a pressure sensor for monitoring the pressure of wash fluid supplied by the wash fluid supply system, and a switch control system for automatically switching an alarm based on one or more readings supplied by the pressure sensor.

Another aspect of the invention relates to a solder plating system comprising a solder plating machine, a wash fluid supply system for supplying wash fluid to the solder plating machine, means for monitoring a pressure of the wash fluid supplied by the wash fluid supply system, and means for triggering an alarm when the wash fluid pressure varies outside preset parameters.

A further aspect of the invention relates to a method of operating a solder plating system comprising supplying wash fluid for a solder plating machine, obtaining pressure readings for the wash fluid supplied to the solder plating machine, and automatically activating an alarm based on one or more of the readings.

A further aspect of the invention relates to a method of operating a solder plating system comprising supplying wash fluid for the solder plating machine, obtaining readings relating to a pressure for the wash fluid supplied to the solder plating machine, and automatically shutting down the solder plating machine based on one or more of the readings.

DETAILED DESCRIPTION OF THE INVENTION

Figure 1:
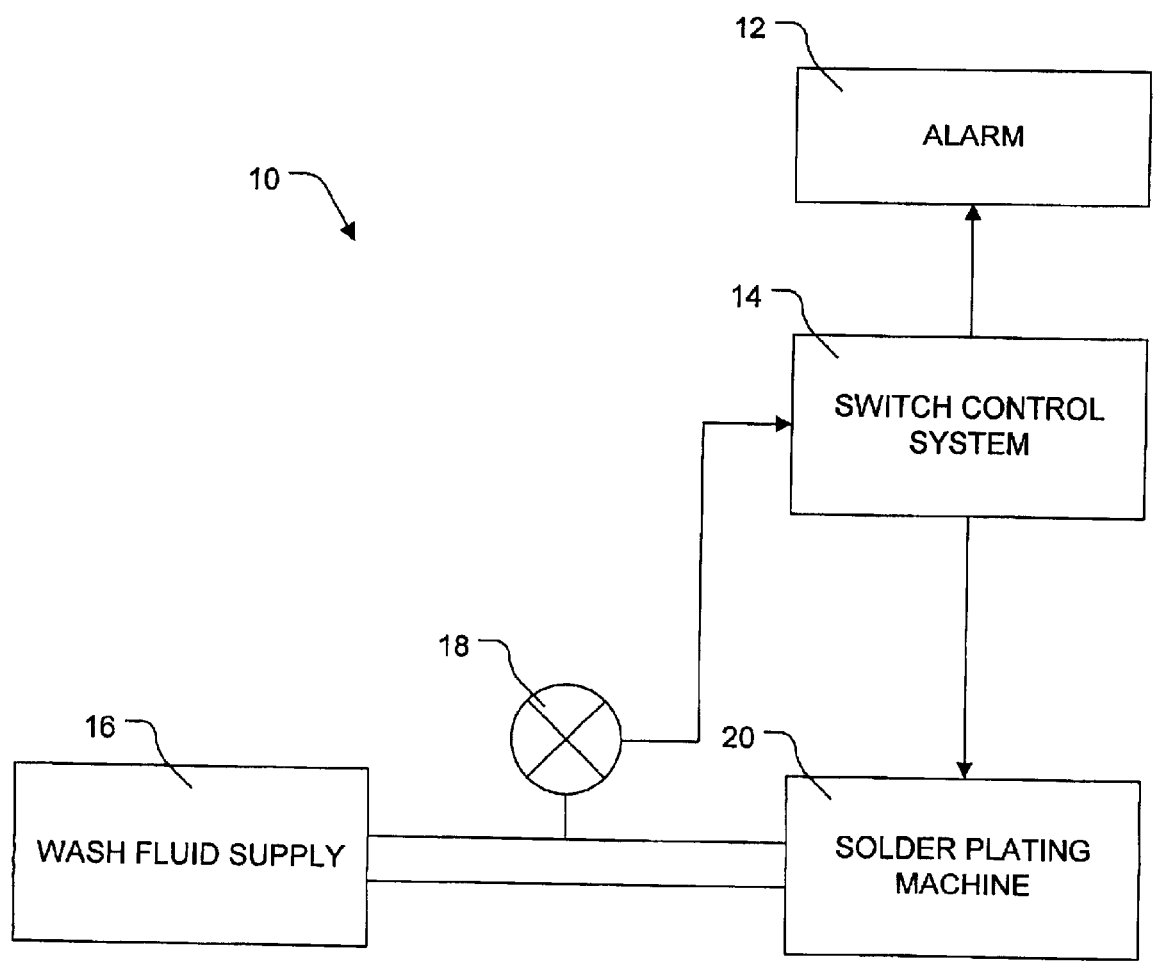
FIG. 1 is a high level schematic of a solder plating system according to one aspect of the present invention.
Figure 2:
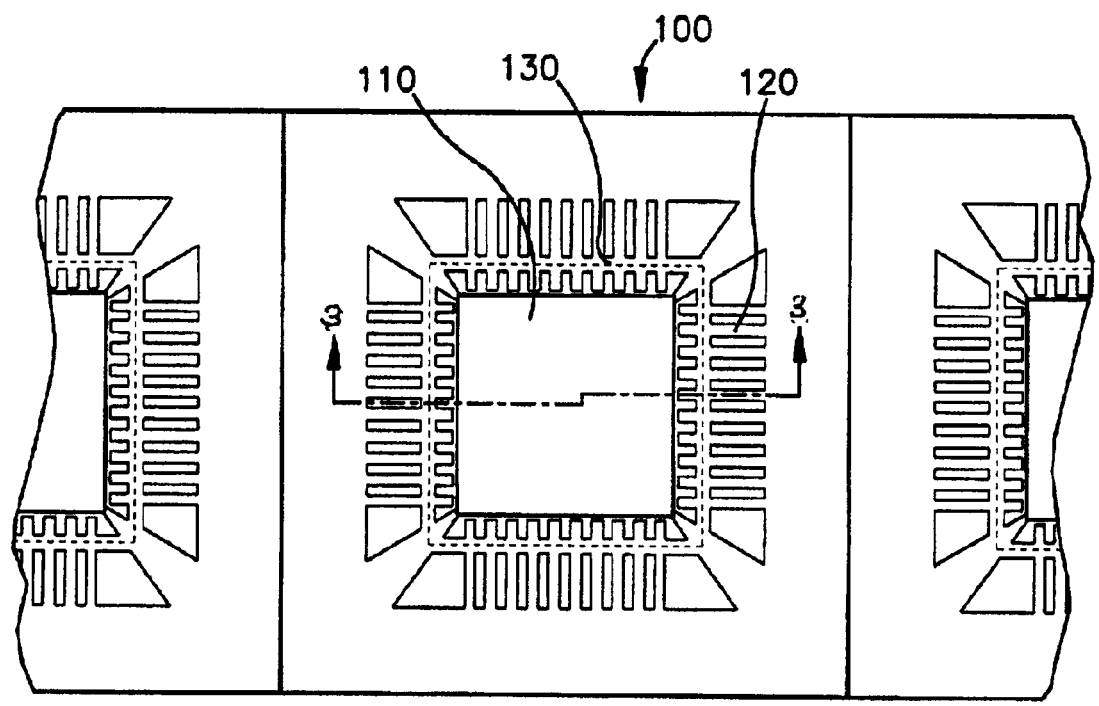
FIG. 2 is an illustration of a lead frame strip.
Figure 3:
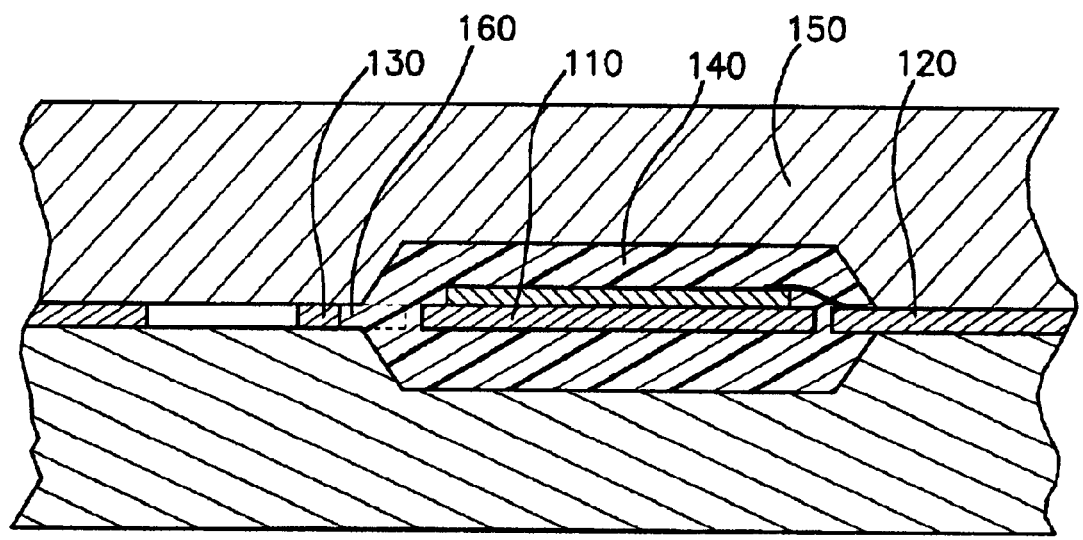
FIG. 3 is a cross-sectional illustration of the lead frame of FIG. 2 along line 3, with an IC die mounted on the lead frame and the lead frame and die placed within a mold.

FIG. 1 is a high level schematic of a solder plating system 10 according to one aspect of the present invention. Solder plating system 10 comprises alarm 12, switch control system 14, wash fluid supply system 16, pressure sensor 18, and solder plating machine 20. Pressure sensor 18 measures the pressure of wash fluid supplied by wash fluid supply system 16. Pressure sensor 18 produces a signal that communicates the pressure measurement to switch control system 14. If the signals received from pressure sensor 18 indicate a problem or possible problem with wash fluid supply system 16, switch control system 14 automatically activates alarm 12 and/or initiates a shutdown of solder plating machine 20.

Solder plating machine 20 can be of any type of solder plating machine, particularly one of those suitable for solder plating lead frames. Such machines are commercially available from companies including AEM_Tech Engineerin Pte Ltd., EBARA Corporation, and PAL Sales, Inc. The lead frames can be of any suitable material, copper being the most common. Solder plating machine 20 can perform such pre-soldering functions as washing and etching of the lead frames.

Solder plating machine 20 deposits solder by any suitable means, including electrolysis. The solder is deposited in a layer, typically from about 1 to about 20 microns thick. The solder can have any suitable composition, including, for example, compositions comprising one or more of tin, indium, bismuth, zinc, nickel, copper, silver, gold, and palladium. The solder can include lead or be lead-free. The purpose of the solder coating is generally to facilitate soldering of leads formed from the lead frame and/or to prevent corrosion of the leads.

After solder plating, solder plating machine 20 washes the lead frames with wash fluid supplied by wash fluid supply system 16. Washing removes residues and/or impurities that can cause corrosion and/or failure of a solderability test. The wash fluid can be organic or inorganic, heated or unheated. Generally, the wash fluid is hot de-ionized water optionally containing a surfactant. The wash fluid is generally sprayed against the plated part with some force. To ensure effective washing, a minimum pressure for the wash fluid may be specified. For example, the wash fluid pressure can be specified to be at least about 20 psi, at least about 25 psi, or at least about 30 psi.

Wash fluid supply system 16 can be part of solder plating machine 20 or can be a separate system and may supply wash fluid for other units. Wash fluid supply system 16 can comprise one or more of a reservoir, a pump, a filter, and a heater. Where the wash fluid is de-ionized water, wash fluid supply system 16 generally comprises an ion exchange resin and one or more filters.

Pressure sensor 18 measures the pressure of the wash fluid supplied by wash fluid supply system 16 and supplies switch control system 14 with a signal indicative of the wash fluid pressure. The signal is generally electrical and can be, for example, a voltage that varies in proportion, or in inverse proportion, to the pressure. The voltage can be stepped up, stepped down, or otherwise scaled to provide a voltage that varies with a desired range.

Switch control system 14 receives the signals from pressure sensor 18. Switch control system 14 can be any device that trips alarm 12 and/or initiates a shutdown of solder plating machine 20 based on signals from pressure sensor 18. For example, switch control system 14 can be a relay that trips alarm 12 when a voltage from pressure sensor 18 drops below a predetermined value, indicating the wash fluid pressure has dropped below a critical value. On the other hand, where the logic of the switch control system is more complicated, switch control system 14 can comprise a logic circuit. If the decision to switch is based on past readings as well as current readings from pressure sensor 18, switch control system 14 can be provided with a memory to record past readings.

Switch control system 14 can be configured to initiate a shutdown of solder plating machine 20 when readings from pressure sensor 18 fall outside of acceptable parameters, thus suggesting a failure or impending failure of wash fluid supply system 16. One way to enable switch control system 14 to initiate a shutdown of solder plating machine 20 is to connect switch control system 14 to a shutoff switch provided with solder plating machine 20.

Whether or not switch control system 14 is configured to initiate a shutdown of solder plating machine 20, switch control system 14 is generally configured to trigger alarm 12. Alarm 12 can be, for example, an audio alarm, a visual alarm, or both. Where switch control system 14 is configured to initiate a shutdown of solder plating machine 20, switch control system 14 can be configured to trigger alarm 12 under the same criteria used to initiate a shutdown of solder plating machine 20 or under different criteria. In one aspect of the invention, switch control system 14 triggers alarm 12 based on signals that suggest a failure of wash fluid supply system 16. In another aspect of the invention, switch control system 14 triggers alarm 12 based on signals that suggest a possible fault in wash fluid supply system 16. In a further aspect of the invention, switch control system 14 triggers alarm 12 based on signals suggesting an approaching failure of wash fluid supply system 16.

A complete loss of wash fluid pressure, even if rather brief, generally indicates a failure of wash fluid supply system 16. A failure can also be indicated by a sustained drop of the pressure below a critical value, for example, about 23 psi or about 25 psi. On the other hand, a brief drop in pressure slightly below a critical value can be deemed acceptable or can be treated as suggesting a possible fault in, or an approaching failure of, wash fluid supply system. A gradual steady decrease in pressure while the pressure remains above a critical value can suggest an approaching failure of wash fluid supply system 16.

The interpretation of pressure readings depends on the nature of the wash fluid supply system 16 and solder plating machine 20 and is the type of information that is generally gather through experiences with particular equipment. In this regard, it can be advantageous to provide switch control system 14 with a series of rules that are used to decide when to activate alarm 12 and/or initiate the shutdown of solder plating machine 20. A rule based switch control system can comprise an expert system, for example.

To accommodate the case in which pressure readings are indicative of wash fluid supply failure or predictive of impending wash fluid supply failure, but the relationships are not readily ascertainable, switch control system 14 can be provided with an artificial intelligence system, such as a neural network, Such a system uses historical data on pressure readings and system failures to develop a predictive capability. Optionally, the artificial intelligence system can improve its predictive capability over time by gathering additional data. Once the artificial intelligence system is trained, it is capable of distinguishing those pressure readings that are indicative of wash fluid supply failure or predictive of impending wash fluid supply failure.

Figure 4:
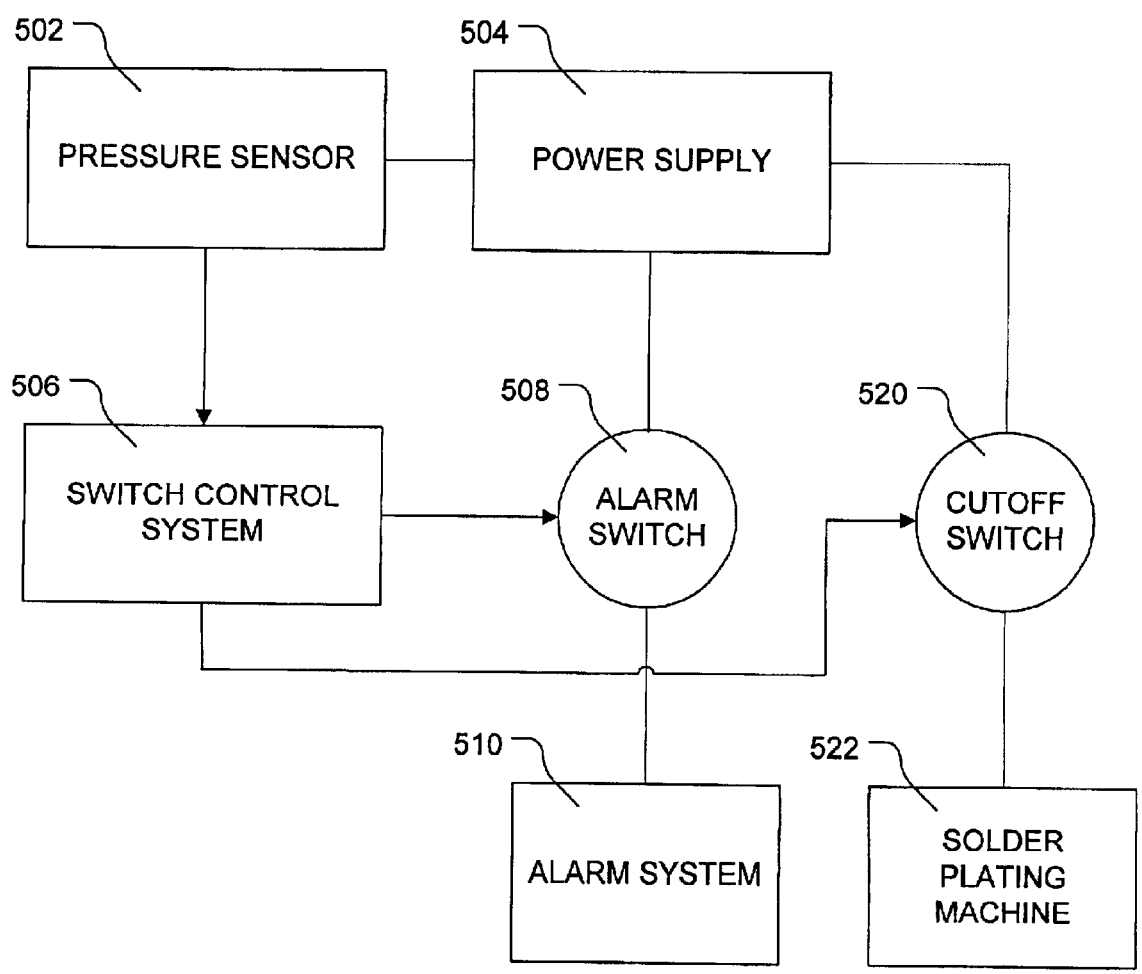
FIG. 4 is a high level schematic of a circuit according to another aspect of the present invention.

FIG. 4 is a high level schematic of a circuit 500 according to another aspect of the present invention. Circuit 500 can be used in a solder plating system 10. Circuit 500 comprises pressure sensor 502, power supply 504, switch control system 506, alarm switch 508, and alarm system 510. Power supply 504 supplies power to pressure sensor 502, alarm 500, solder plating machine 522, and control system 506, where control system 506 requires a power supply. Switch control system 506 receives signals from pressure sensor 502 and controls alarm switch 508 and cutoff switch 520. Alarm switch 508 switches alarm system 510. Cutoff switch 520 shuts down solder plating machine 522.

While power supply 504 is illustrated as supplying power to each of pressure sensor 502, alarm 500, and solder plating machine 522, these component can have separate power supplies. In adapting a commercially available solder plating machine into a system according to the present, it is convenient to power the various circuit components using one power source, which can be the solder plating machine's power supply. Such a power supply provides, for example, about 24 VDC.

Likewise, cutoff switch 520 is conveniently a cutoff switch supplied as part of solder plating machine 522. Such a cutoff can provide an orderly shutdown of solder plating machine 522. However, cutoff switch 520 can cut off the power to solder plating machine 522 without following any particular procedure.

Switch control system 506 can comprise a logic control circuit. A logic control circuit permits the implementation of complex decisions to activate alarm switch 508 and/or cutoff switch 520. However, a logic circuit is not required and switch control system 506 can comprise one or more switches or relays that control alarm switch 508 and/or cutoff switch 520.

One aspect of the invention relates to solder plating systems in which the switch control system controls only one of an alarm system and a solder plating machine. In this regard, either the alarm switching components or the solder plating machine controlling components are optional. In addition, alarm switch 508 and/or cutoff switch 520 are optional to the extent their functions can be carried out by switch control system 506.

Figure 5:
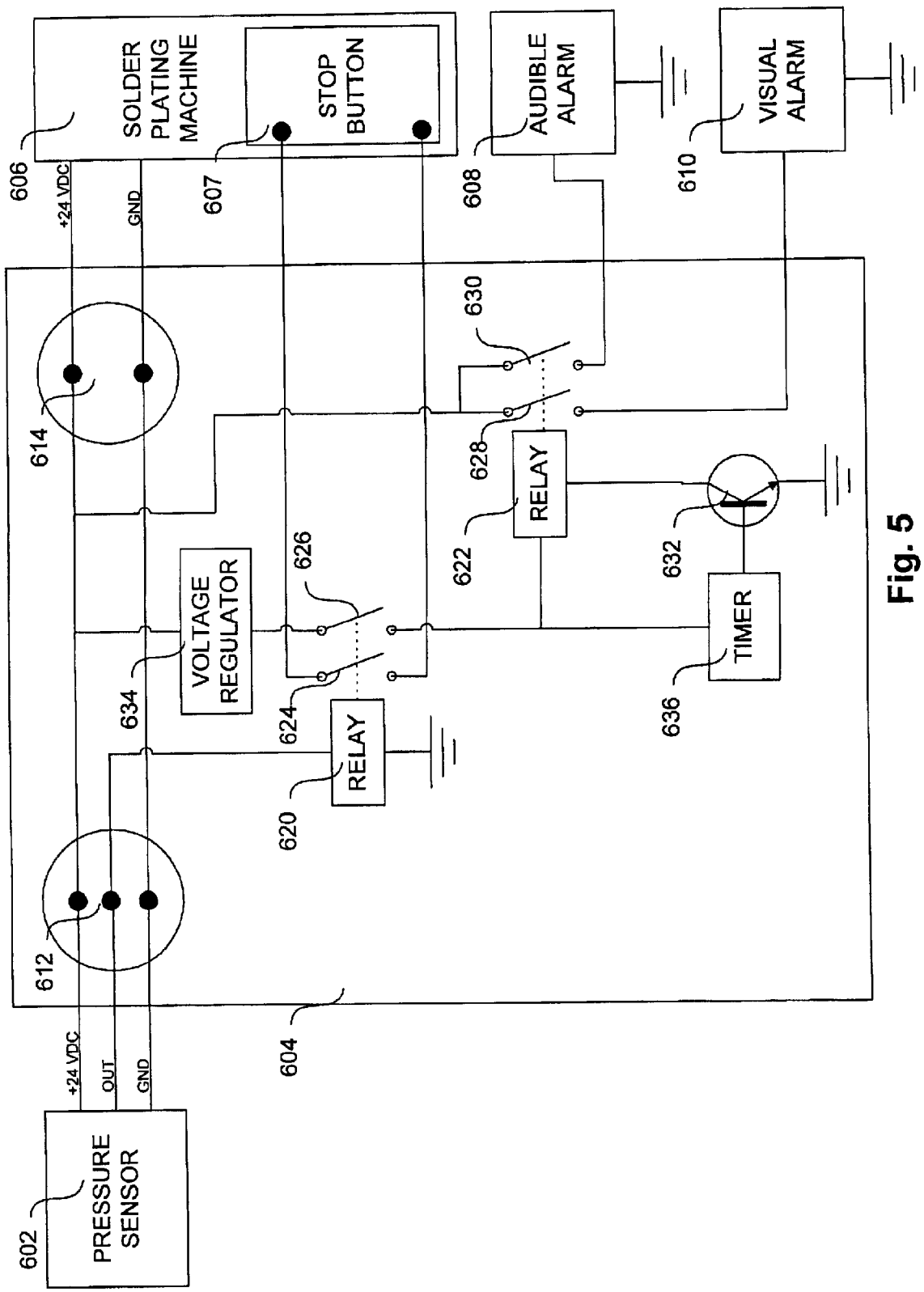
FIG. 5 is a schematic of an exemplary circuit according to a further aspect of the present invention.

FIG. 5 is a schematic illustration of an exemplary circuit 600 according to one aspect of the present invention. Circuit 600 comprises pressure sensor 602, circuit board 604, solder plating machine 606, audile alarm 608, and visual alarm 610. Pressure sensor 602 and solder plating machine 606 plug into circuit board 604 at connection points 612 and 614 respectively. Circuit board 604 is also connected to stop button 607 on solder plating machine 606, audible alarm 608, and visual alarm 610.

Circuit board 604 comprises relays 620 and 622, switches 624, 626, 628, 630, and 623, voltage regulator 634, and timer 636. Relay 620 is triggered when the output of pressure sensor 602 exceeds a critical value. Relay 620 in turn controls switches 624 and 626. Switch 624 activates stop bottom 607. Switch 626 activates timer 636 which, through switch 632, causes relay 622 to alternately open and close. Relay 622 controls switches 628 and 630. Power from voltage regulator 634 is provided to alarms 608 and 610 through switchers 628 and 630. When relays 622 alternately opens and closes, alarms 608 and 610 cycle on and off. Thus, when the voltage from pressure sensor 602 exceeds a critical value, circuit board 604 shuts down solder plating machine 606 and initiates alarm signals, which cycle or pulsate.

Figure 6:
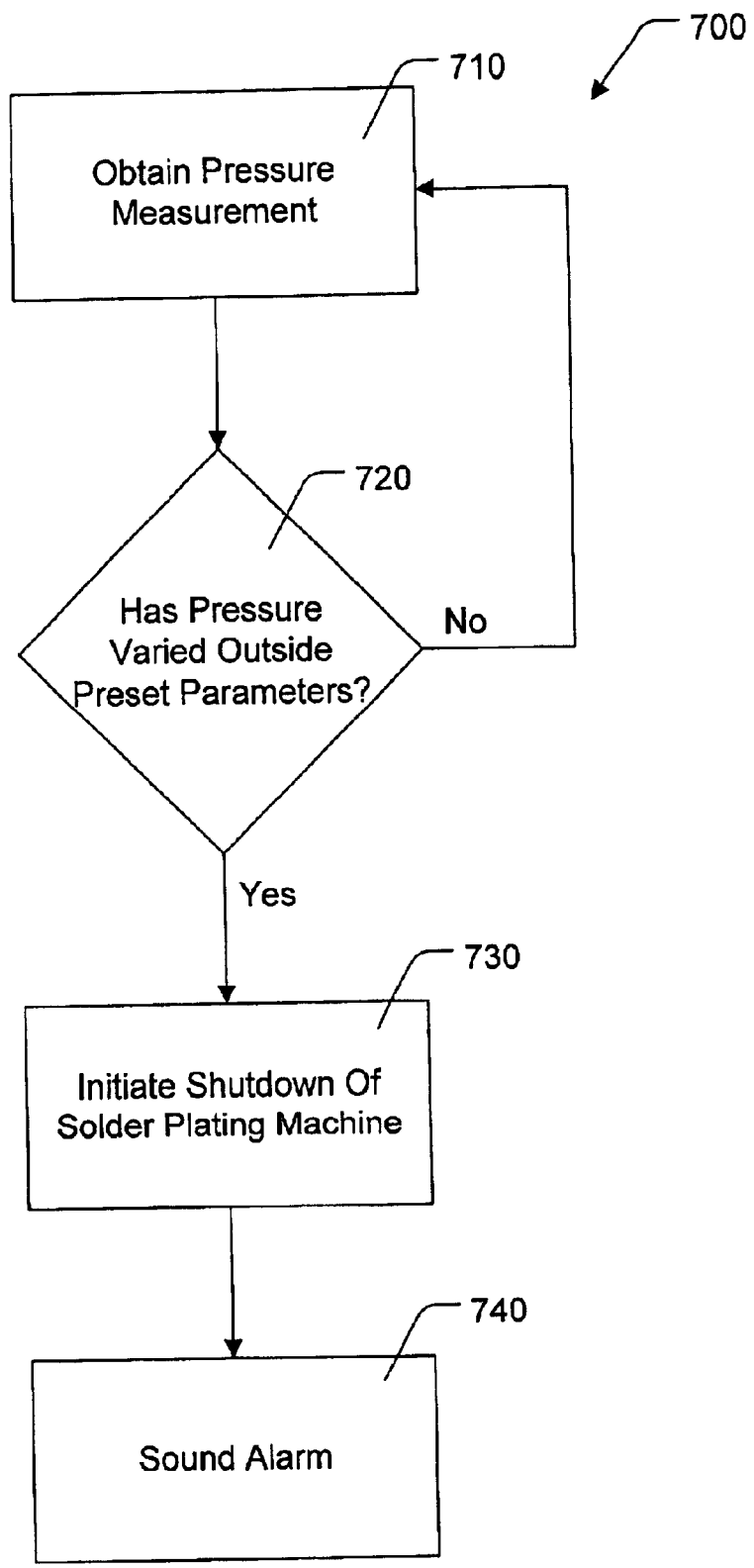
FIG. 6 is a flow diagram of a operating a solder plating system according to a further aspect of the present invention.

FIG. 6 is a flow diagram of a method 700 of operating a solder plating system. In step 710, a pressure measurement is taken from a wash fluid supply. In step 720, the determination is made whether the pressure has varied outside pre-set parameters. This determination can involve historical pressure measurements or only the most recent measurements. The present parameter can be simply a minimum pressure limit or can be more broadly defined, for example, to permit temporary fluctuations in the pressure below a pre-set limit or to detect a gradual decrease in pressure that may forecast an imminent failure.

Monitoring of the pressure continues while the pressure remains within the preset parameters. If the pressure goes outside the preset parameters, a shutdown of the solder plating machine is implemented in step 730 and an alarm is activated in step 740. In a variation of this method, the step of shutting down the solder machine is skipped or initiated based on different criteria from those employed in deciding whether to trigger an alarm.

What has been described above is the present invention and several of its specific aspects. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A solder plating system, comprising:
   a solder plating machine;
   a wash fluid supply system for supplying wash fluid to the solder plating machine;
   a pressure sensor for monitoring the pressure of wash fluid supplied by the wash fluid supply system; and
   a switch control system for automatically switching an alarm based on one or more readings supplied by the pressure sensor and a plurality of rules that detect and/or predict a problem with the wash fluid supply.

2. The solder plating system of claim 1, wherein the switch control system automatically shuts down the solder plating machine based on one or more readings supplied by the pressure sensor.

3. The solder plating system of claim 1, wherein the switch control system activates an alarm when the wash fluid pressure drops below a first value.

4. The solder plating system of claim 3, wherein the switch control system automatically shuts down the solder plating machine when the wash fluid pressure drops below a second value.

5. The solder plating system of claim 1, wherein the switch control system includes a memory that retains readings supplied by the pressure sensor.

6. The solder plating system of claim 5, wherein the switch control system further comprises and expert system.

7. The solder plating system of claim 5, wherein the switch control system automatically shuts down the solder plating machine based on a reading supplied by the pressure sensor together with one or more retained readings.

8. A method of operating a solder plating system, comprising:
   supplying wash fluid for a solder plating machine;
   obtaining pressure readings for the wash fluid supplied to the solder plating machine; and
   automatically activating an alarm based on one or more of the readings and a plurality of rules that detect and/or predict a problem with the wash fluid supply.

9. The method of claim 8, wherein automatically activating the alarm is based on a reading that indicates the pressure is below a threshold value.

10. The method of claim 8, further comprising retaining readings relating to the pressure for the wash fluid and wherein automatically activating the alarm depends in part on retained readings.

11. The method of claim 8, wherein automatically activating an alarm based on one or more of the readings comprises using an expert system to decide whether to activate the alarm.

12. A method of operating a solder plating system, comprising:
   supplying wash fluid for the solder plating machine;
   obtaining readings relating to a pressure for the wash fluid supplied to the solder plating machine; and
   automatically shutting down the solder plating machine based on one or more of the readings and a plurality of rules that detect and/or predict a problem with the wash fluid supply.

13. The method of claim 12, wherein automatically shutting down the solder plating machine is based on a reading that indicates the pressure is below a threshold value.

14. The method of claim 12, wherein automatically shutting down the solder plating machine based on one or more of the readings comprises using an expert system to decide whether to shut down the solder plating machine.

15. A solder plating system, comprising:

a solder plating machine;

a wash fluid supply system for supplying wash fluid to the solder plating machine;

a pressure sensor for monitoring the pressure of wash fluid supplied by the wash fluid supply system; and a switch control system including an adaptive system for triggering an alarm and/or shutting down the solder platting machine based at least upon one or more readings supplied by the pressure sensor.

16. The system of claim 15, wherein the adaptive system is an expert system.

17. The system of claim 15, wherein the adaptive system utilizes a neural network.

* * * * *